(12) United States Patent
Zhang et al.

(10) Patent No.: US 8,745,007 B2
(45) Date of Patent: Jun. 3, 2014

(54) METHOD OF HANDLING LARGE VOLUMES OF SYNCHROPHASOR MEASURMENTS FOR REAL TIME EVENT REPLAY

(75) Inventors: Guorui Zhang, San Jose, CA (US); Hongtao Chen, Cupertino, CA (US)

(73) Assignee: Electric Power Research Institute, Inc., Charlotte, NC (US)

( * ) Notice: Subject to any disclaimer, the term of this patent is extended or adjusted under 35 U.S.C. 154(b) by 575 days.

(21) Appl. No.: 12/538,960

(22) Filed: Aug. 11, 2009

(65) Prior Publication Data

US 2011/0040786 A1    Feb. 17, 2011

(51) Int. Cl.
*G06F 7/00* (2006.01)
*G06F 17/30* (2006.01)

(52) U.S. Cl.
USPC .......................................................... 707/661

(58) Field of Classification Search
USPC ...................................................... 707/661
See application file for complete search history.

(56) References Cited

U.S. PATENT DOCUMENTS

| | | | |
|---|---|---|---|
| 2003/0058277 A1* | 3/2003 | Bowman-Amuah | 345/765 |
| 2005/0041767 A1* | 2/2005 | Whitehead et al. | 375/376 |
| 2010/0082987 A1* | 4/2010 | Thom et al. | 713/171 |

* cited by examiner

*Primary Examiner* — Kuen Lu
(74) *Attorney, Agent, or Firm* — Trego, Hines & Ladenheim, PLLC

(57) ABSTRACT

A method is provided for handling synchrophasor measurements relating to an electrical power system. The method includes: (a) acquiring a plurality of synchrophasor measurements containing data representing at least one power system event; (b) inserting and storing the event related synchrophasor measurements in a database as a partitioned binary large object (BLOB); (c) reading and transferring the synchrophasor measurements related to a user selected current or historical event from the database to a client computer partition by partition; and (d) processing the event data at the client computer on a partition-by-partition basis such that the client computer will be able to start a replay of the event replay as soon as processing of the first partition of the event BLOB data is completed.

13 Claims, 3 Drawing Sheets

METHOD OF HANDLING LARGE VOLUMES OF SYNCHROPHASOR MEASURMENTS FOR REAL TIME EVENT REPLAY

BACKGROUND OF THE INVENTION

The present invention relates generally to a method for analyzing electrical power systems, and more particularly to a method for managing, transferring and visualizing synchrophasor measurement data related to power system events.

Generally, electrical power originates at a generation station and is transmitted to a load by a system of conductors and other equipment that make up an electrical power system. The equipment that makes up an electric power system can include generators, transmission lines, busbars, switches, reclosers, insulators, capacitors, and the like. Over time, or as the result of some particular incidents, the generators, transmission lines, or other equipment can cease to operate normally or fail. Sometimes a failure results in an abnormally high current that can further damage the power system, injure end users, or damage end user devices and equipment or cause large scale cascading power system outages. Failures also sometimes result in degraded power quality or loss of electric service.

In an effort to identify failures or conditions that may lead to failure, utilities may monitor the operation of an electrical power system by evaluating one or more signals indicative of power system properties such as voltage magnitudes, voltage phase angles, currents, phase angle differences between two buses, etc. One such method is using synchrophasor measurements for real-time security monitoring and post event analysis.

A "phasor" is a complex number representation of magnitude and phase angle in AC electrical signals. Phasors can be measured using commercially available phasor measurement units ("PMUs") located at or near the substations or generation stations of an interconnected electric power system being monitored. Typically, multiple PMUs will be installed at geographically spread-apart locations within an electrical power system. The PMUs may be synchronized by global positioning system ("GPS") clock signal so that simultaneous measurements may be taken by a group of PMUs, which are then transferred to a phasor data center. These are referred to as "synchrophasors".

Once synchrophasor data is collected it may be transferred to a user's computer equipped with a software visualization application that creates a graphical representation of the data, and evaluated by a power system operator or operational planning engineers or reliability coordinator for improving their situational awareness of interconnected power systems. Typically, synchrophasor measurements are taken at a scan rate of 30 samples per second. A power system event or a sequence of power system events, such as large generator outages or transmission line outages, generate a large volume of synchrophasor measurements related to the events in a specified time period (typically one minute to several minutes).

Prior art power system visualization applications using PMU data are mainly based on client-server technology in which each power system event is stored and transferred within the system as a data object. They lack high fidelity event replay with dynamic voltage or frequency contour calculations 30 times per second and cannot support a large number of simultaneous users. Furthermore, using existing visualization technology, it can take a long time (for example 30 to 50 minutes) for a user to be able to start the event replay for a current event or for a selected previous event and therefore it was not possible to perform near real-time event replay for monitoring and analyzing the on-going events.

BRIEF SUMMARY OF THE INVENTION

These and other shortcomings of the prior art are addressed by the present invention, which according to one aspect provides for handling synchrophasor measurements relating to an electrical power system. The method includes: (a) acquiring a plurality of synchrophasor measurements containing data representing at least one power system event; (b) Inserting and storing the event related synchrophasor measurements in a database as a partitioned binary large object (BLOB); (c) Reading and transferring the synchrophasor measurements related to a user selected event from the database to a client computer partition by partition; and (d) Processing the event data at the client computer on a partition-by-partition basis such that the client computer will be able to start a replay of the event replay as soon as processing of the first partition of the event BLOB data is completed.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
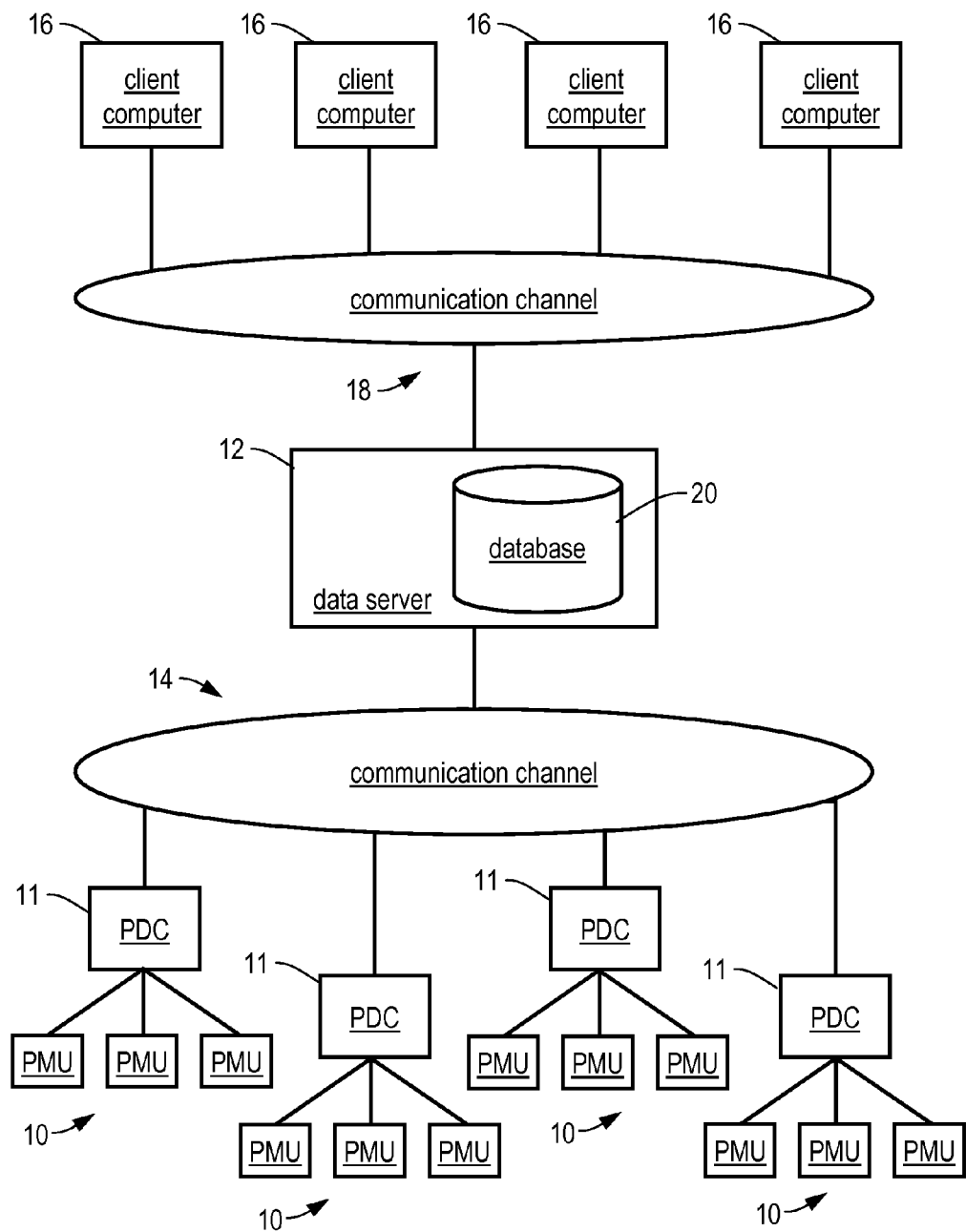
FIG. 1 is a schematic diagram of a monitoring system for an electric power system constructed according to one aspect of the present invention.

Referring to the drawings wherein identical reference numerals denote the same elements throughout the various views, an exemplary power system event visualization system constructed according to an aspect of the present invention is illustrated in FIG. 1. The system comprises a number of PMUs 10 which are connected to selected parts of an electric power system (not shown). Groups of the PMUs 10 are coupled to phasor data concentrators ("PDCs") 11, for example through dedicated lines or through a packet-switched network such as the Internet. The PDCs are computerized units of a known type which collect event data packets from the PMUs 10. The PDCs 11 are coupled to a data server 12 through a first communication channel 14. The data server 12 is in turn coupled to a plurality of client computers 16 through a second communication channel 18. It should be understood that the present invention may be implemented in any portion of an electric power system, including but not limited to generating stations, substations, transmission lines, primary and secondary distribution lines, and customer facilities.

Each of the PMUs is of a known type which is capable of making synchrophasor measurements several times per second (for example 30 times per second) and then transmitting the measurements in a selected data format. A non-limiting example of a suitable PMU is a model 1690 Phasor Measurement Unit available from Macrodyne, Inc., Clifton Park, N.Y. 12065 USA.

The first communication channel 14 may be a direct connection such as serial or parallel cables, wireless links, dedicated communication network, or the like. Furthermore, the PMUs may be connected to the data server 12 through a communications network such as a local area network (LAN), a wide area network (WAN), or the Internet (which may be secured).

Like the first communication channel 14, the second communication channel 18 may also be a direct connection, a wireless link, or a communications network such as a local area network (LAN), a wide area network (WAN), or the Internet (which may be secured). The first and second communication channels 14 and 18 may be the same channel, especially if a network is used.

Figure 2:
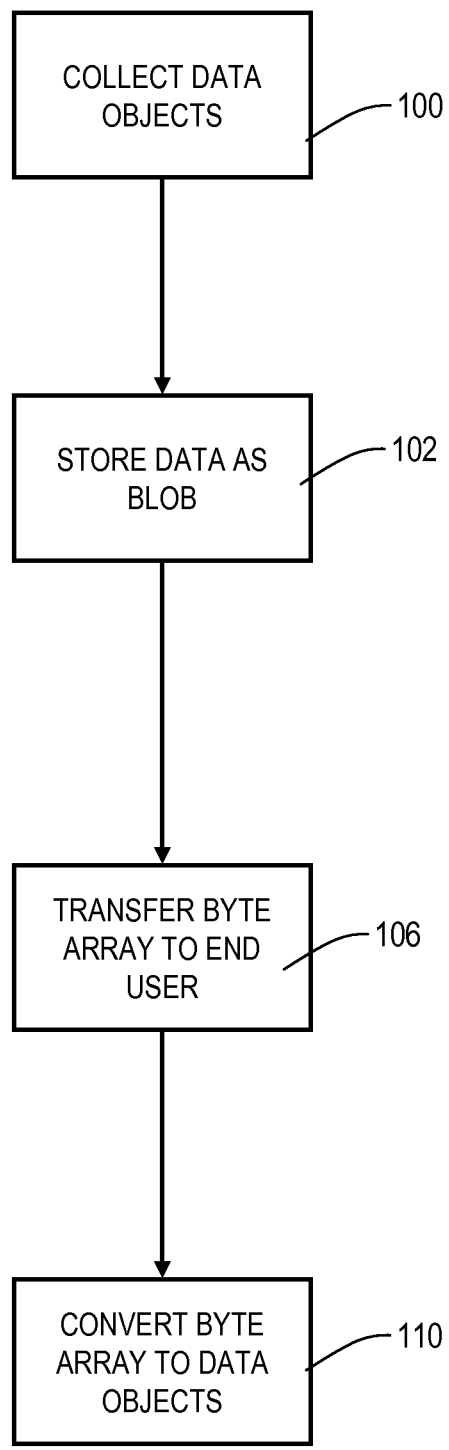
FIG. 2 is a block diagram of a data transfer process according to one aspect of the present invention.

FIG. 2 illustrates schematically the data transfer process. At block 100, a known event data collection application collects event data from the PMUs 10. Event data is collected to cover the entire time period of a power system event for near real-time event replay or for post event analysis. As used herein, the term "power system event" is used to refer to any deviation from steady-state operation which is deemed to be significant for analytical purposes. Non-limiting examples of power system events include actual or incipient equipment failures, as well as normal operational events. An example of a selection criterion would be a simple limit value in a measured or derived parameter. For example, if a root-mean-square (RMS) current in one or more phases on a power system exceeds a predetermined threshold level, this could indicate the presence of a fault current which exceeds normal system load (a type of power system event). Other types of criteria, such as a limit value on allowable deviation of a measured quantity from its estimated nominal value, or matching observed data to templates representative of certain kinds of failures or incipient failures, could also be used. When one or more of the selection criteria are met, the data being observed is referred to as a "power system event." The system may be configured to store and transfer data continuously or to only record data when a selection criterion is triggered.

The event data is transmitted from the PMUs 10 to the data server 12 is in the form of a collection of data objects. An object is a known type of data structure which includes both data fields and procedures. The following listing is an example of the data structure for the event data objects:

```
#region Data structure of the interface data object classes
[System.Serializable( )]
public class SFMS_UnitPointData
{
    public string PointName;
    public float Value;
    public int Quality;
}
[System.Serializable( )]
public class SFMS_UnitData
{
    public int UnitNumber;
    public List<SFMS_UnitPointData> PointDataList =
        new List<SFMS_UnitPointData>( );
}
[System.Serializable( )]
public class SFMS_DataObj
{
    public DateTime UtcTime;
    public List<SFMS_UnitData> UnitDataList =
        new List<SFMS_UnitData>( );
}
#end region
```

The large volume of event related synchrophasor measurements are inserted into an event oriented database (item 20, see FIG. 1) on a partition basis as a binary large object ("BLOB"). Each partition of an event BLOB may typically contain about 2 seconds to several seconds of synchrophasor measurements. A BLOB is a known type of database entity. An event BLOB may include many partitions (for example, about 50 to several hundreds). Testing has shown that it is typically many times faster to insert or retrieve a set of event related synchrophasor measurements into a relational database using a BLOB than to insert or retrieve the synchrophasor measurements on row-by-row basis.

When a user desires to visualize a newly detected event or a previous event, a database query is transmitted from the client computer 16 to the data server 12. The BLOB-formatted data of the selected event in the database 20 is retrieved on partition-by-partition basis as an event BLOB from the database 20. Each partition of the event BLOB data, which is stored in byte array format, is transferred to the client computer 16 through the second communication channel 18 (block 106).

At the client computer 16, the byte arrays are de-serialized into a collection of data objects (block 110) which are stored in the memory database of a visualization application on the client computer 16 for various types of visualization displays with known visualization software, and displayed in a desired format on the client computer 16, with full resolution of the synchrophasor measurements.

The method described herein will allow the users to replay a real-time event (which is in progress) or a historical event as soon as the first partition of the event data is retrieved at the a client computer 16 without waiting for retrieving the complete set of all the event partitions. The event data will be transferred from the application data server to the client computer on partition basis. The users will be able to perform the near real-time event replay using the visualization application.

Figure 3:
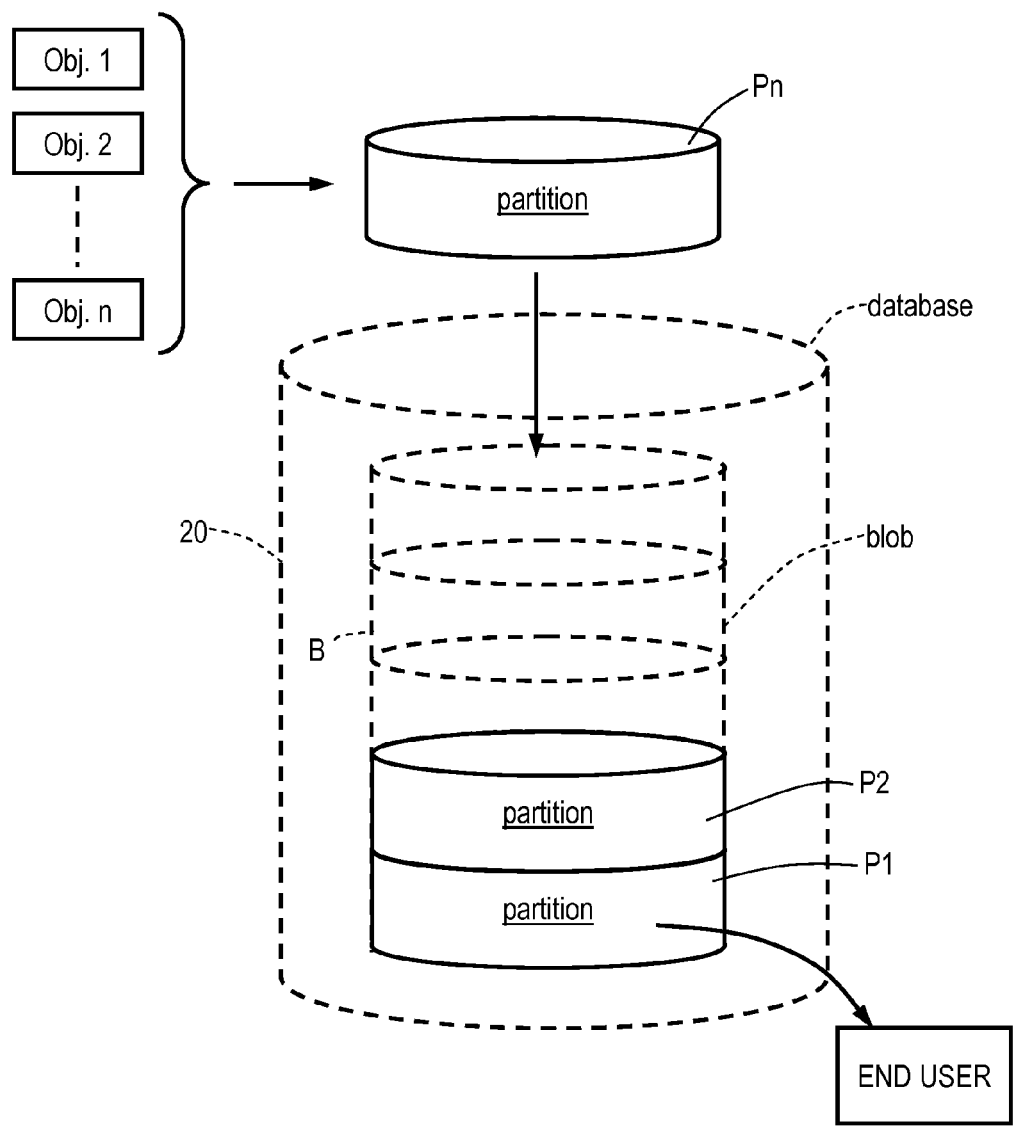
FIG. 3 is a schematic illustration of a data partitioning process.

FIG. 3 illustrates this process in schematic form. The event data is collected in binary object format and stored in the database on a partition basis as described above as a BLOB "B" in the database 20. The partitions are represented schematically as P1, P2 ... Pn. Each partition contains a selected number of objects (shown as Obj. 1, Obj. 2 ... Obj. n in FIG. 3). The partition size can be configured and tuned according to the system environment to achieve optimal performance for the post event analysis. A non-limiting example of a typical event data partition size would be approximately 200 to 500 data objects per partition.

When a user desires to visualize an event, a database query is transmitted from the client computer 16 to the data server 12 as described above. In response to the query, the data is transferred from the database 20 to the client computer 16 on a partition-by-partition, "first-in, first-out" basis. At the client computer 16, the first partition P1 is de-serialized, again using a known protocol, into a collection of data objects which are then stored in the memory database of the visualization application on the client computer 16. Once the data objects in the first partition P1 are re-formed, the data represented therein is available to be processed and displayed in a desired format on the client computer 16. The user may thus begin the event replay without waiting for the completion of the transfer and de-serialization of the entire set of event data in the BLOB. The remaining partitions of the event data are transferred from the database 20 and de-serialized as a background process while the user is replaying the first partition P1 of the event data.

EXAMPLE

Testing of the method described above was conducted by recording a power system event using 49 PMUs each taking 30 samples per second, collecting about 10,000 data objects over about five minutes, resulting in about 10 MB total data, and containing about 1.5 million individual point measurements.

The results of the performance testing are shown in the Table below. In particular, it is noted that using prior art techniques, it took 644 seconds to insert the event data to the event oriented database. After implementing the process described above, the time for inserting the event data was dramatically reduced to 33 seconds. It is also noted that using prior art techniques, it took about 25 seconds to read the event data from the event oriented database. After implementing the process described above, the time for reading the complete set of event data was dramatically reduced to 1 second. These improvements are mainly attributable to the use of the BLOB data structure. Furthermore, for the existing event stored in the event database, it took about 189 seconds using the prior art method, from the user request for event replay to the completion of data transfer and the start of the event replay. After the implementation of the present invention, it took less than 2 seconds after the user's request to start playing the event. This improvement is mainly attributable to the use of event data partitioning. This initial performance test was conducted using commercially-available "PC-compatible" microcomputers to represent the data server 12 and a client computer 16, demonstrating that no special computer hardware is required to achieve substantial benefits from the method described herein. However, even better results could be expected using higher speed computers.

|  | Prior Art (Seconds) | Invention (Seconds) |
|---|---|---|
| Time for data server to insert event data into event database: | 644 | 33 |
| Time for data server to read event data from event database: | 25.3 | 0.95 |
| Time for reading the complete set of event data, including reading data from database, data transfer from data server to client computer and deserialization (if applicable): | 184 | 40 |
| Time from event replay request until visualization display begins: | 189 | 2 |
| Visualization display shows up after a new event is detected: | 858 | About 5 |

The method described above will enable the users to perform the near real-time event replay of the current event as soon as the initial or current partition of the event data is available for visualization at the client computer. The user will be able to start an event replay (fast or slow motion modes) about 5 to 10 seconds after a new event is detected. It should be noted that the performance will not be affected very much by the length of the event time period (for example from one minute to 30 minutes) using this method.

The method described above has several advantages over prior art data packaging, managing and transfer methods for handling large volumes of synchrophasor measurements of large electrical power systems. It will make it possible for power system operators to perform near real-time event replay a few seconds after a new event is detected to monitor and analyze an on-gong event. It provides wide area power system visualization and high fidelity near real-time event replay or post-event replay using a smart client by fully utilizing the local computer resources and Internet/Intranet technology. It dramatically improves the performance of event replay by efficiently handling large volume synchrophasor measurements. And, it allows a user to quickly start the event replay without waiting for the completion of transfer and processing of the entire event data.

While the method described above has been explained in the context of managing and transferring partitioned data from a data server to an end user, it will be understood that this process can also be applied to managing, storing and transferring of synchrophasor data from the PMUs 10 to the PDCs 11 in order to dramatically improve their performance. The same concepts are also useful in any other application which requires the transfer of synchrophasor measurements from one location to another.

The foregoing has described a method and system for power system event visualization in an electrical power system. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

What is claimed is:

1. A method for handling synchrophasor measurements relating to an electrical power system, comprising:
   (a) acquiring a plurality of synchrophasor measurements containing data objects representing operation of the electrical power system;
   (b) applying a predetermined selection criterion to the synchrophasor measurements, the selection criterion comprising a limit value of a measured or derived electrical parameter, wherein satisfaction of the selection criteria indicates that the synchrophasor measurements represent a power system event, a power system event being defined as a deviation from steady-state operation of the electrical power system;
   (c) when the selection criterion is met, inserting and storing the synchrophasor measurements representing the power system event in a database as a partitioned binary large object (BLOB);
   (d) reading and transferring the synchrophasor measurements related to a user selected power system event from the database to a client computer partition by partition; and
   (e) de-serializing the partitions at the client computer on a partition-by-partition basis such that the client computer will be able to start a replay of the power system event as soon as processing of the first partition of the event BLOB data is completed.

2. The method of claim 1 wherein the data objects are generated by a plurality of data collection units.

3. The method of claim 2 wherein the data collection units are phasor measurement units which collect synchrophasor data.

4. The method of claim 3 wherein the phasor measurement units are coupled to phasor data concentrators which are in turn coupled to the data server.

5. The method of claim 1 further comprising, at the client computer, creating a visual display of the data contained within the data objects.

6. The method of claim 5 wherein the first communication channel is a data network.

7. The method of claim 1 wherein the data is acquired from the data collection units through a first communication channel.

8. The method of claim 1 wherein the data is transferred to the client computer through a second communication channel.

9. The method of claim 8 wherein the second communication channel is a data network.

10. The method of claim 1 wherein the database is stored on the server.

11. The method of claim 10 further comprising sequentially transferring the partitions of the binary large object to the client computer in the order in which they were inserted into the database.

12. The method of claim 11 further comprising de-serializing the first of the partitions substantially immediately after it is received at the client computer.

13. The method of claim 12 further comprising sequentially de-serializing the partitions as they are received at the client computer in a background process, while the data contained in one or more partitions are being presented in a visual display.

* * * * *